(12) United States Patent
Li

(10) Patent No.: US 12,279,472 B2
(45) Date of Patent: Apr. 15, 2025

(54) QUANTUM DOT LIGHT EMITTING DIODE, METHOD FOR MANUFACTURING THE SAME, AND DISPLAY DEVICE

(71) Applicants: Beijing BOE Technology Development Co., Ltd., Beijing (CN); BOE TECHNOLOGY GROUP CO., LTD., Beijing (CN)

(72) Inventor: Dong Li, Beijing (CN)

(73) Assignees: Beijing BOE Technology Development Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/772,612

(22) PCT Filed: May 31, 2021

(86) PCT No.: PCT/CN2021/097396
§ 371 (c)(1),
(2) Date: Apr. 28, 2022

(87) PCT Pub. No.: WO2022/252052
PCT Pub. Date: Dec. 8, 2022

(65) Prior Publication Data
US 2024/0172469 A1 May 23, 2024

(51) Int. Cl.
*H10K 50/16* (2023.01)
*H10K 50/115* (2023.01)
(Continued)

(52) U.S. Cl.
CPC ......... *H10K 50/166* (2023.02); *H10K 50/115* (2023.02); *H10K 71/13* (2023.02); *H10K 2101/40* (2023.02); *H10K 2102/351* (2023.02)

(58) Field of Classification Search
CPC .... H10K 50/166; H10K 50/115; H10K 71/13; H10K 2101/40
(Continued)

(56) References Cited

U.S. PATENT DOCUMENTS

| 2013/0228753 A1 | 9/2013 | Moon et al. |
| 2016/0064699 A1 | 3/2016 | Park et al. |

(Continued)

FOREIGN PATENT DOCUMENTS

| CN | 105679958 A | 6/2016 |
| CN | 109148704 A | 1/2019 |

(Continued)

*Primary Examiner* — Quoc D Hoang
(74) *Attorney, Agent, or Firm* — HOUTTEMAN LAW LLC

(57) ABSTRACT

Embodiments of the present disclosure provide a quantum dot light emitting diode, a method for manufacturing a quantum dot light emitting diode and a display device. The quantum dot light emitting diode includes an anode layer, a cathode layer, a quantum dot light emitting layer between the anode layer and the cathode layer, and an electron transport layer between the cathode layer and the quantum dot light emitting layer, the electron transport layer includes at least a first energy level structure layer, a second energy level structure layer, and another first energy level structure layer, which are sequentially stacked, the first energy level structure layer is different from the second energy level structure layer, and a Lowest Unoccupied Molecular Orbital energy level of the first energy level structure layer is different from that of the second energy level structure layer.

18 Claims, 9 Drawing Sheets

(51) Int. Cl.
*H10K 71/13* (2023.01)
*H10K 101/40* (2023.01)
*H10K 102/00* (2023.01)

(58) Field of Classification Search
USPC .......................................................... 257/40
See application file for complete search history.

(56) References Cited

U.S. PATENT DOCUMENTS

2019/0189945 A1* 6/2019 Chung ................. H10K 50/165
2021/0119161 A1* 4/2021 Han ..................... H10K 50/166
2021/0359214 A1* 11/2021 Kang .................. H10K 85/615

FOREIGN PATENT DOCUMENTS

| CN | 109728179 A | 5/2019 |
| CN | 110718636 A | 1/2020 |
| CN | 111435710 A | 7/2020 |
| CN | 111490170 A | 8/2020 |
| CN | 112151689 A | 12/2020 |
| TW | 201407855 A | 2/2014 |
| WO | WO 2020256431 A1 | 12/2020 |

* cited by examiner

QUANTUM DOT LIGHT EMITTING DIODE, METHOD FOR MANUFACTURING THE SAME, AND DISPLAY DEVICE

TECHNICAL FIELD

The present disclosure belongs to the field of display technology, and particularly relates to a quantum dot light emitting diode, a method for manufacturing a quantum dot light emitting diode and a display device.

BACKGROUND

A Quantum Dot Light Emitting Diode (QLED) typically includes a light emitting layer provided with a plurality of quantum dot nanocrystals. The light emitting layer is sandwiched between an electron transport layer and a hole transport layer. By applying an electric field to the QLED, electrons and holes are transported into the light emitting layer. In the light emitting layer, the electrons and the holes are trapped in quantum dots and recombined, thereby emitting photons.

SUMMARY

An embodiment of the present disclosure provides a quantum dot light emitting diode, including an anode layer, a cathode layer, a quantum dot light emitting layer between the anode layer and the cathode layer, and an electron transport layer between the cathode layer and the quantum dot light emitting layer, where the electron transport layer includes at least a first energy level structure layer, a second energy level structure layer, and another first energy level structure layer, which are sequentially stacked, the first energy level structure layer is different from the second energy level structure layer, and a Lowest Unoccupied Molecular Orbital (LUMO) energy level of the first energy level structure layer is different from that of the second energy level structure layer.

In some implementations, the Lowest Unoccupied Molecular Orbital energy level of the first energy level structure layer is higher than that of the second energy level structure layer.

In some implementations, the Lowest Unoccupied Molecular Orbital energy level of the first energy level structure layer is lower than that of the second energy level structure layer.

In some implementations, the Lowest Unoccupied Molecular Orbital energy level of the first energy level structure layer is different from that of the second energy level structure layer by about 0.1 eV to about 0.5 eV.

In some implementations, a total thickness of the electron transport layer ranges from about 20 nm to about 150 nm.

In some implementations, a material of at least one of the first energy level structure layer and the second energy level structure layer is doped zinc oxide.

In some implementations, a material of one of the first energy level structure layer and the second energy level structure layer is zinc oxide, and a material of the other one of the first energy level structure layer and the second energy level structure layer is doped zinc oxide.

In some implementations, an element doped in the doped zinc oxide includes at least one of gallium, indium, yttrium, copper, zirconium, aluminum and magnesium, or any combination thereof.

In some implementations, a doping concentration of dopant element in the doped zinc oxide ranges from about 0% to about 50%.

In some implementations, the electron transport layer includes a plurality of first energy level structure layers and a plurality of second energy level structure layers, the first energy level structure layers and the second energy level structure layers are stacked alternately, and each of a side of the electron transport layer close to the cathode layer and a side of the electron transport layer close to the quantum dot light emitting layer is provided thereon with the first energy level structure layer or the second energy level structure layer.

In some implementations, a value of a root mean square of surface roughness of the electron transport layer ranges from 1 nm to 10 nm.

In some implementations, the quantum dot light emitting diode further includes a hole transport layer and a hole injection layer, where the cathode layer, the electron transport layer, the quantum dot light emitting layer, the hole transport layer, the hole injection layer and the anode layer are sequentially stacked on a base.

An embodiment of the present disclosure further provides a method for manufacturing a quantum dot light emitting diode, including steps of forming an anode layer, a cathode layer, a quantum dot light emitting layer between the anode layer and the cathode layer, and an electron transport layer between the cathode layer and the quantum dot light emitting layer, where the step of forming the electron transport layer includes:
forming a first energy level structure layer, a second energy level structure layer, and another first energy level structure layer, which are sequentially stacked, with the first energy level structure layer being different from the second energy level structure layer, and a Lowest Unoccupied Molecular Orbital (LUMO) energy level of the first energy level structure layer being different from that of the second energy level structure layer.

In some implementations, the forming the first energy level structure layer, the second energy level structure layer, and the first energy level structure layer, which are sequentially stacked, includes:
depositing the first energy level structure layer, the second energy level structure layer, and the first energy level structure layer by a sputtering method, a sol-gel method, or an atomic layer deposition method.

In some implementations, the method for manufacturing a quantum dot light emitting diode further includes:
depositing the quantum dot light emitting layer on the electron transport layer by printing; and
sequentially depositing a hole transport layer and a hole injection layer on the quantum dot light emitting layer by evaporation.

In some implementations, the electron transport layer is formed so that the Lowest Unoccupied Molecular Orbital energy level of the first level structural layer is different from that of the second level structural layer by about 0.1 eV to about 0.5 eV.

In some implementations, the forming the first energy level structure layer, the second energy level structure layer, and the first energy level structure layer, which are sequentially stacked, includes:
using a doped zinc oxide material to form at least one of the first energy level structure layer and the second energy level structure layer.

In some implementations, the forming the first energy level structure layer, the second energy level structure layer, and the first energy level structure layer, which are sequentially stacked, includes:

using a zinc oxide material to form one of the first energy level structure layer and the second energy level structure layer from; and using a doped zinc oxide material to form the other one of the first energy level structure layer and the second energy level structure layer.

In some implementations, the using a doped zinc oxide material includes:

using a doped zinc oxide material doped with at least one of gallium, indium, yttrium, copper, zirconium, aluminum and magnesium, or any combination thereof.

In some implementations, the using a doped zinc oxide material includes:

using a doped zinc oxide material having a doping concentration of dopant element ranging from about 0% to about 50%.

In some implementations, forming the first energy level structure layer, the second energy level structure layer, and the first energy level structure layer, which are sequentially stacked, includes:

forming a plurality of first energy level structure layers and a plurality of second energy level structure layers, with the first energy level structure layers and the second energy level structure layers being stacked alternately, and each of a side of the electron transport layer close to the cathode layer and a side of the electron transport layer close to the quantum dot light emitting layer being provided with the first energy level structure layer or the second energy level structure layer.

An embodiment of the present disclosure further provides a display device, including a display substrate including a plurality of quantum dot light emitting diodes arranged in an array, where the plurality of quantum dot light emitting diodes include the quantum dot light emitting diode described above.

DETAIL DESCRIPTION OF EMBODIMENTS

Figure 1:
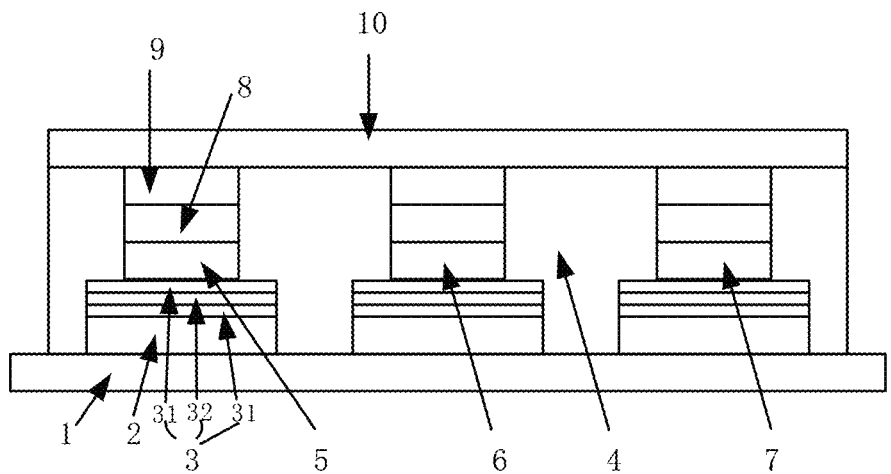
FIG. 1 is a schematic diagram of a structure formed by applying an inverted QLED to a display substrate according to an embodiment of the present disclosure.

In order to enable those skilled in the art to better understand the technical solutions of the present application, the technical solutions of the present application are further described in detail below with reference to the accompanying drawings and specific embodiments.

Unless otherwise defined, technical terms or scientific terms used herein should have general meanings that can be understood by people with ordinary skills in the technical field of the present disclosure. In the present disclosure, the words "an", "a", "the" and the like are not intended to limit the quantity, but represent existence of "at least one"; the words "include", "comprise" and the like indicate that an element or object before the words covers the elements or objects or the equivalents thereof listed after the words, rather than excluding other elements or objects; and the words indicating positional relationships (e.g., on) are only used to indicate relative positional relationships, and when an absolute position of an object described is changed, the relative positional relationships of the object may also be changed accordingly A basic structure of a light emitting device includes an anode layer, a cathode layer, and a light emitting layer between the anode layer and the cathode layer. Under the action of an external applied voltage, electrons and holes are injected from the cathode layer and the anode layer respectively, migrate and are combined in the light emitting layer to generate excitons, and energy of the excitons is attenuated in the form of light, that is, emitting light. In a case where a material of the light emitting layer is quantum dots, the light emitting layer is a quantum dot light emitting layer, and the light emitting device is a QLED correspondingly.

Light emitting devices may be upright light emitting devices or inverted light emitting devices. A light emitting device generally includes a substrate; for an upright light emitting device, an anode layer is closer to a substrate than a cathode layer; and for an inverted light emitting device, a cathode layer is closer to a substrate than an anode layer. Whether a light emitting device is an upright light emitting device or an inverted light emitting device, the light emitting device may be a top-emission light emitting device or a bottom-emission light emitting device; in a case where the light emitting device is an upright top-emission light emitting device, an anode layer is a reflective electrode, and a cathode layer is a transmissive electrode; in a case where the light emitting device is an upright bottom-emission light emitting device, the anode layer is a transmissive electrode, and the cathode layer is a reflective electrode; in a case where the light emitting device is an inverted top-emission light emitting device, the anode layer is a transmissive electrode, and the cathode layer is a reflective electrode; and in a case where the light emitting device is an inverted bottom-emission light emitting device, the anode layer is a reflective electrode, and the cathode layer is a transmissive electrode.

With continuous optimization of performance of the light emitting device, in addition to the anode layer, the cathode layer and the light emitting layer, the light emitting device may further include a Hole Injection Layer (HIL) and a Hole Transport Layer (HTL) disposed between the anode layer and the light emitting layer, and an Electron Transport Layer (ETL) disposed between the light emitting layer and the cathode Layer. Moreover, an Electron Injection Layer (EIL) may be further disposed between the electron transport layer and the cathode layer.

At present, in the field of QLEDs, inorganic zinc oxide has been gradually used as a material of electron transport layers due to wide band gap, high electron mobility, and relatively good transparency and conductivity. However, since zinc oxide has a relatively high electron transport rate ($200\ cm^2V^{-1}\ s^{-1}$ to $300\ cm^2V^{-1}\ s^{-1}$), an electron transport rate is greater than a hole transport rate in a QLED device, resulting in excessive injection of electrons, therefore, the electrons are excessively accumulated in the quantum dot light emitting layer, causing unbalanced injection of carriers (electrons and holes), and quantum yield (QY) of the quantum dot light emitting layer is reduced due to non-radiative recombination (e.g., Auger recombination), thereby affecting QLED performance (e.g., luminous efficiency).

In the related art, excessive accumulation of the electrons in the light emitting layer may be partially alleviated by adding an electron blocking layer between the electron transport layer and the quantum dot light emitting layer. However, the added electron blocking layer usually includes an insulating material, such as polymethyl methacrylate (PMMA), aluminum oxide ($Al_2O_3$) or silicon dioxide ($SiO_2$); and for an electron blocking layer including these materials, a thickness of the electron blocking layer should be precisely controlled and is generally desired to be less than 1 nm, which proposes strict process requirements. If the thickness of the electron blocking layer is relatively large, a turn-on voltage of the QLED, i.e., a voltage for turning on the QLED, may be significantly increased, and if the thickness of the electron blocking layer becomes larger, it may occur that the electrons cannot be injected into the Quantum Dots (QDs), which prevents the QLED from emitting light normally.

In addition, the electron transport rate may be adjusted and controlled by doping other metal elements (such as magnesium, aluminum, and a combination thereof) in the electron transport layer. However, a change of a ratio of doped element in the electron transport layer can not only change an energy level of the electron transport layer, but also change a difference of energy level between the electron transport layer and a layer adjacent to the electron transport layer (e.g., the cathode layer or the quantum dot light emitting layer). If injection of the electrons from the cathode layer to the electron transport layer becomes easy, injection of the electrons from the electron transport layer to the quantum dot light emitting layer may become difficult. Conversely, if the injection of the electrons from the electron transport layer to the quantum dot light emitting layer becomes easy, the injection of the electrons from the cathode layer to the electron transport layer may become difficult. Therefore, when the electron transport rate of the electron transport layer of zinc oxide is adjusted by doping the other metal elements in the electron transport layer, the QLED performance is not only affected by a single variable, and multiple variables may lead to difficulty in adjustment of energy level and make it hard to guarantee desired QLED performance.

In view of the above, an embodiment of the present disclosure provides a quantum dot light emitting diode (QLED), which includes an anode layer, a cathode layer, a quantum dot light emitting layer between the anode layer and the cathode layer, and an electron transport layer between the cathode layer and the quantum dot light emitting layer, the electron transport layer includes at least a first energy level structure layer, a second energy level structure layer, and another first energy level structure layer, which are sequentially stacked, the first energy level structure layer is different from the second energy level structure layer, and a Lowest Unoccupied Molecular Orbital (LUMO) energy level of the first energy level structure layer is different from that of the second energy level structure layer.

It should be understood that the QLED according to the embodiment of the present disclosure may be of an upright type or an inverted type and may also be of a top-emission type or a bottom-emission type, which is not particularly limited by the present disclosure.

For convenience of description, a case where the QLED in the embodiment of the present disclosure is of the inverted type is taken as an example in the following description.

FIG. 1 is a schematic diagram of a structure formed by applying an inverted QLED to a display substrate according to the embodiment of the present disclosure. As shown in FIG. 1, the display substrate includes a base 1, and an array of inverted QLEDs disposed on the base 1. Each of the inverted QLEDs may include a cathode 2, an electron transport layer 3, a QD light emitting layer, a hole transport layer 8, a hole injection layer 9 and an anode 10, which are sequentially stacked on the base 1. The QLEDs are respectively disposed in openings of a pixel defining layer 4 on the base 1.

The base 1 may be a transparent base, for example, the base may be made of glass, quartz, or polyethylene terephthalate (PET), but the embodiment of the present disclosure is not limited thereto, and those skilled in the art may select a proper material for the base 1 as desired.

The cathode 2 may be a transparent electrode, for example, the cathode 2 may be a single-layer film made of Indium Tin Oxide (ITO), fluorine-doped tin oxide (FTO), or a conductive polymer. Alternatively, the cathode 2 may be an opaque electrode, for example, the cathode 2 may be a metal electrode made of an opaque metal, such as aluminum (Al) or silver (Ag). In addition, the cathode 2 may be a multi-layer film (e.g., ITO/Ag/ITO) made of, for example, ITO and other metal materials (e.g., Ag). However, the embodiment of the present disclosure is not limited thereto, and those skilled in the art may select a proper material for the cathode 2 as desired.

A thickness of the cathode 2 may range from about 10 nm to about 100 nm.

The electron transport layer 3 includes at least a first energy level structure layer 31, a second energy level structure layer 32, and another first energy level structure layer 31, which are sequentially stacked, the first energy level structure layer 31 is different from the second energy level structure layer 32, and an LUMO energy level of the first energy level structure layer 31 is different from that of the second energy level structure layer 32.

That is to say, it is possible that the electron transport layer 3 includes the first energy level structure layers 31 on each of a side of the electron transport layer 3 close to the cathode 2 and a side of the electron transport layer 3 close to the quantum dot light emitting layer, the second energy level structure layer 32 is sandwiched between the two first energy level structure layers 31, and the LUMO energy level of the second energy level structure layer 32 is higher or lower than LUMO energy levels of the first energy level structure layers 31 on two sides of the second energy level structure layer 32.

In a case where the LUMO energy level of the second energy level structure layer 32 is higher than the LUMO energy levels of the first energy level structure layers 31 on the two sides of the second energy level structure layer 32, an energy level barrier for electron transport is formed in the electron transport layer 3, thereby hindering the electron transport and reducing the electron transport rate; and in a case where the LUMO energy level of the second energy level structure layer 32 is lower than the LUMO energy levels of the first energy level structure layers 31 on the two sides of the second energy level structure layer 32, an energy level trap for the electron transport is formed in the electron transport layer 3, thereby hindering the electron transport and reducing the electron transport rate.

In the QLED according to the embodiment of the present disclosure, by adopting the electron transport layer 3 including the first energy level structure layer 31, the second energy level structure layer 32 and the first energy level structure layer 31, which are sequentially stacked, the electron transport rate is reduced, unbalanced injection of carriers is alleviated, accumulation of electrons in the quantum dot light emitting layer is reduced, a reduction of QY caused by non-radiative recombination (e.g., Auger recombination) in the quantum dot light emitting layer is effectively reduced or avoided, and OLED performance (e.g., luminous efficiency) is ensured to a certain extent, thereby ensuring a display effect of the display substrate.

In addition, in the QLED according to the embodiment of the present disclosure, a change of energy level composition in the electron transport layer 3 does not affect a difference of energy level between the electron transport layer 3 and the cathode 2 or between the electron transport layer 3 and the quantum dot light emitting layer, so that carrier injection in the QLED can be balanced more effectively. Moreover, in the QLED according to the embodiment of the present disclosure, a thickness of the electron transport layer 3 is not desired to be strictly controlled within a very small range, thereby simplifying process requirements.

As an example, in the QLED according to the embodiment of the present disclosure, the thickness of the electron transport layer 3 may range from about 20 nm to about 150 nm. For example, the thickness of the electron transport layer 3 may be about 80 nm, in such case, a thickness of the first energy level structure layer 31 may be about nm, and a thickness of the second energy level structure layer 32 may be about 20 nm. In another example, the thickness of the electron transport layer 3 may be about 60 nm, in such case, the thickness of the first energy level structure layer 31 may be about 20 nm, and the thickness of the second energy level structure layer 32 may be about 20 nm.

In fact, the thickness of the first energy level structure layer 31 may range from about 5 nm to about 50 nm, the thickness of the second energy level structure layer 32 may range from about 10 nm to about 50 nm, and the first energy level structure layers 31 on the two sides of the second energy level structure layer 32 may have the same thickness or have different thicknesses, and the thickness of the first energy level structure layer 31 may be the same as or different from that of the second energy level structure layer 32. Moreover, electron transport layers 3 of all QLEDs applied to a same display substrate may have the same thickness or have different thicknesses, which is not particularly limited in the embodiment of the present disclosure, and the thicknesses of the electron transport layers 3 of all the QLEDs applied to the same display substrate may be selected by those skilled in the art as desired.

The pixel defining layer 4 is configured to define each of the QLEDs, so as to prevent short circuits between the QLEDs and prevent cross color between the QLEDs of various colors. A specific structure and a specific material of the pixel defining layer 4 are not particularly limited in the embodiment of the present disclosure, and those skilled in the art may select a proper structure and a proper material for the pixel defining layer 4 as desired.

As an example, as shown in FIG. 1, the quantum dot light emitting layer may include a red quantum dot light emitting layer 5, a green quantum dot light emitting layer 6, or a blue quantum dot light emitting layer 7, so that a QLED of a corresponding color may be formed.

A thickness of the quantum dot light emitting layer of each color may vary from about 20 nm to about 50 nm, and the quantum dot light emitting layers of various colors may have the same thickness or have different thicknesses, which is not particularly limited in the embodiment of the present disclosure, and the thicknesses of the quantum dot light emitting layers of various colors may be selected by those skilled in the art as desired.

According to various expectation, hole transport layers 8 of all QLEDs applied to a same display substrate may have the same thickness or have different thicknesses, and hole injection layers 9 of all QLEDs applied to a same display substrate may have the same thickness or have different thicknesses. The thicknesses of the hole transport layers 8 and those of the hole injection layers 9 of all the QLEDs applied to the same display substrate are not particularly limited in the embodiment of the present disclosure, and may be selected by those skilled in the art as desired.

It should be understood that, in some implementations, the hole transport layer 8 and the hole injection layer 9 may be omitted from the QLED of the embodiment of the present disclosure.

As shown in FIG. 1, the anodes 10 of all the QLEDs applied to the same display substrate may be shared, and the anodes 10 may be transparent or opaque conductive films, for example, a material of the anodes 10 may be Indium Zinc Oxide (IZO), aluminum (Al) or silver (Ag), which is not particularly limited in the embodiment of the present disclosure, and the material of the anodes 10 may be selected by those skilled in the art as desired.

A thickness of the anode 10 may range from about 10 nm to about 100 nm.

Figure 2:
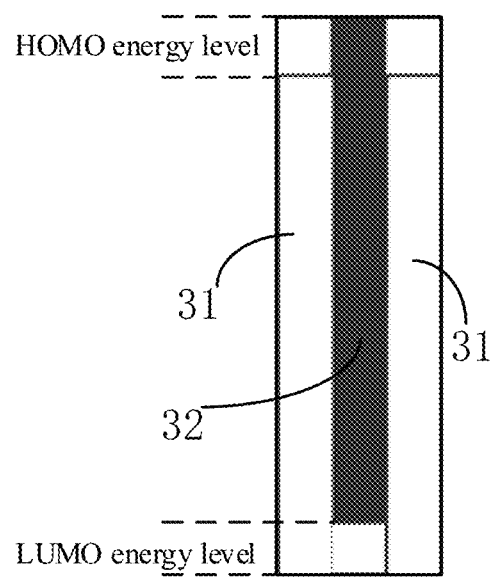
FIG. 2 is a schematic diagram of energy levels of an electron transport layer in a QLED according to an embodiment of the present disclosure.

FIG. 2 is a schematic diagram of energy levels of an electron transport layer in a QLED according to an embodiment of the present disclosure. The energy levels of the first energy level structure layer 31, the second energy level structure layer 32, and the first energy level structure layer 31 are respectively shown in FIG. 2 from left to right or from right to left. As shown in FIG. 2, the LUMO energy level of the second energy level structure layer 32 may be higher than the LUMO energy levels of the first energy level structure layers 31, in such case, an energy level barrier may be formed in the electron transport layer 3, thereby hindering the electron transport and reducing the electron transport rate.

In order to realize balanced injection of the carriers (the electrons and the holes) in the QLED, the LUMO energy level of the second level structural layer 32 may be higher than the LUMO energy levels of the first level structural layers 31 by about 0.1 eV to about 0.5 eV.

As an example, a material of the first level structural layer 31 may be a zinc oxide (ZnO) material, the LUMO energy level of the first level structural layer 31 may range from about −4.8 eV to about −4.6 eV, a material of the second level structural layer 32 may be a zinc oxide material doped with gallium (Ga) (referred to as GZO hereinafter), and the LUMO energy level of the second level structural layer 32 may range from about −4.6 eV to about −4.3 eV. In such case, the LUMO energy level of the second level structural layer 32 may be higher than that of the first level structural layer 31.

Figure 3:
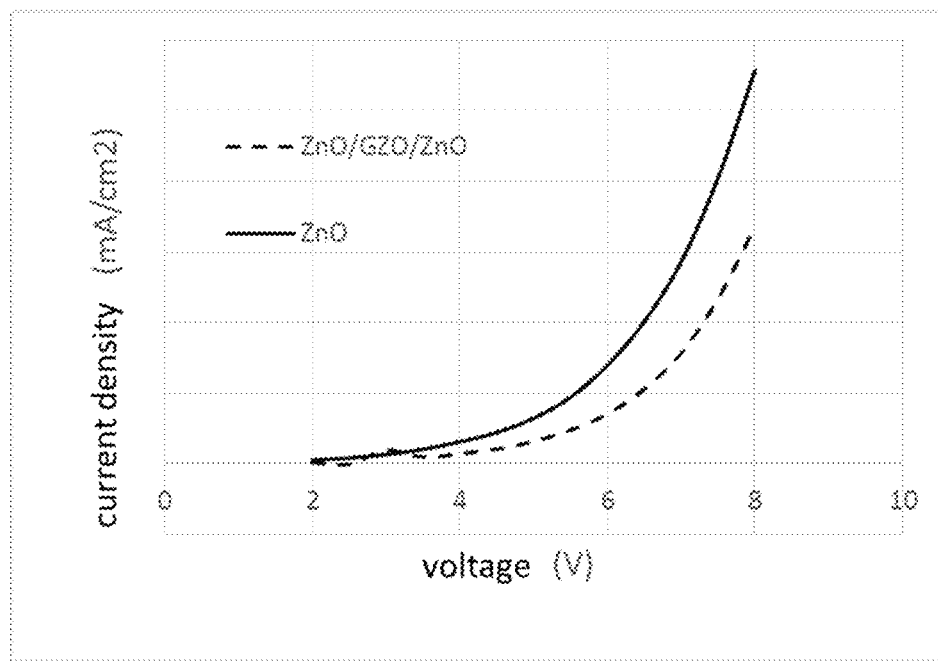
FIG. 3 is a schematic diagram illustrating a relationship between a current density and a voltage of the electron transport layer having the energy levels shown in FIG. 2 and a relationship between a current density and a voltage of an electron transport layer in the related art.

FIG. 3 is a schematic diagram illustrating a relationship between a current density and a voltage of the electron transport layer 3 having the energy levels shown in FIG. 2 and a relationship between a current density and a voltage of an electron transport layer in the related art.

As shown in FIG. 3, the solid line illustrates the relationship between the current density and the voltage of the electron transport layer in the related art, and the dashed line illustrates the relationship between the current density and the voltage of the electron transport layer 3 having the energy levels shown in FIG. 2. In this example, a material of the electron transport layer in the related art is ZnO; and in the electron transport layer 3 having the energy levels shown in FIG. 2, the material of the first energy level structure layers 31 is ZnO, and the material of the second energy level structure layer 32 is GZO. As shown in FIG. 3, compared with the electron transport layer in the related art, the electron transport layer 3 having the energy levels shown in FIG. 2 has a reduced current density, that is, a reduced electron transport rate.

Figure 4:
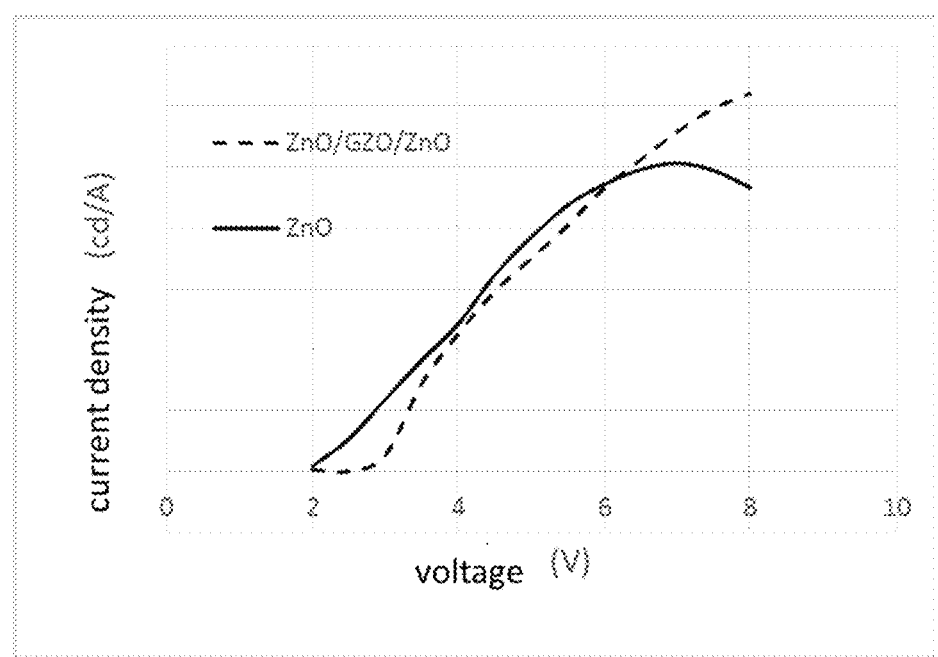
FIG. 4 is a schematic diagram illustrating a relationship between current efficiency and a voltage of the electron transport layer having the energy levels shown in FIG. 2 and a relationship between current efficiency and a voltage of the electron transport layer in the related art.

FIG. 4 is a schematic diagram illustrating a relationship between current efficiency and a voltage of the electron transport layer having the energy levels shown in FIG. 2 and a relationship between current efficiency and a voltage of the electron transport layer in the related art.

As shown in FIG. 4, the solid line illustrates the relationship between the current efficiency and the voltage of the electron transport layer in the related art, and the dashed line illustrates the relationship between the current efficiency and the voltage of the electron transport layer 3 having the energy levels shown in FIG. 2. In this example, the material of the electron transport layer in the related art is ZnO; and in the electron transport layer 3 having the energy levels shown in FIG. 2, the material of the first energy level structure layers 31 is ZnO, and the material of the second energy level structure layer 32 is GZO. As shown in FIG. 4, compared with the current efficiency of the electron transport layer in the related art, the current efficiency of the electron transport layer 3 having the energy levels shown in FIG. 2 is slightly reduced at first but is increased to some extent later.

FIG. 3 and FIG. 4 illustrate the relationship between the current density and the voltage and the relationship between the current efficiency and the voltage of the electron transport layer 3 in which the LUMO energy level of the second energy level structure layer 32 is higher than the LUMO energy levels of the first energy level structure layers 31. However, as described above, the LUMO energy level of the second energy level structure layer 32 may be lower than the LUMO energy levels of the first energy level structure layers 31, in such case, an energy level trap is formed in the electron transport layer 3, thereby hindering the electron transport and reducing the electron transport rate.

In order to balance the injection of the carriers (the electrons and the holes) in the QLED, the LUMO energy level of the second energy level structure layer 32 may be lower than the LUMO energy levels of the first energy level structure layers 31 by about 0.1 eV to about 0.5 eV.

Moreover, in the electron transport layer 3 of the QLED according to the embodiment of the present disclosure, a Highest Occupied Molecular Orbital (HOMO) energy level of the second energy level structure layer 32 may be higher than HOMO energy levels of the first energy level structure layers 31, as shown in FIG. 2. However, the HOMO energy level of the second energy level structure layer 32 may be lower than the HOMO energy levels of the first energy level structure layers 31. Whether the HOMO energy level of the second energy level structure layer 32 is higher or lower than the HOMO energy levels of the first energy level structure layers 31 is not particularly limited in the embodiment of the present disclosure, and may be decided by those skilled in the art as desired. For example, since the electron transport layer 3 can also prevent the holes from reaching the cathode to reduce a hole leakage current, while the LUMO energy levels of the first energy level structure layers 31 and the second energy level structure layer 32 are appropriately set to reduce the electron transport rate of the electron transport layer 3, the HOMO energy levels of the first energy level structure layers 31 and the second energy level structure layer 32 may also be appropriately set to enable the electron transport layer 3 to effectively prevent the holes from reaching the cathode, so as to reduce a hole current, thereby making the injections of the electrons and the holes in the QLED more balanced, and enabling the QLED to emit light more stably.

Figure 5:
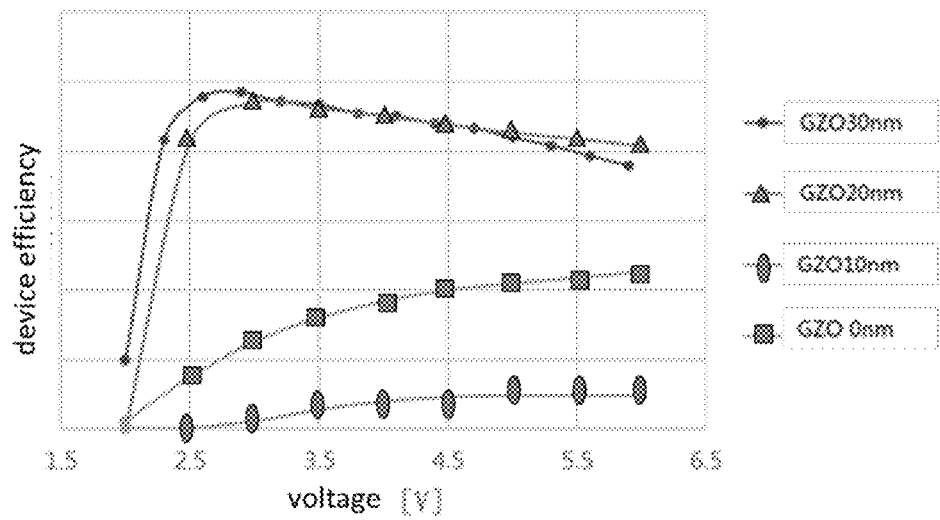
FIG. 5 is a schematic diagram illustrating a relationship between a thickness of a second energy level structure layer in the electron transport layer having the energy levels shown in FIG. 2 and device efficiency.

FIG. 5 is a schematic diagram illustrating a relationship between a thickness of the second energy level structure layer 32 in the electron transport layer 3 having the energy levels shown in FIG. 2 and device efficiency.

Taking a case where the material of the first energy level structure layers 31 is ZnO, the material of the second energy level structure layer 32 is GZO, and a total thickness of the electron transport layer 3 is about 60 nm as an example, as shown in FIG. 5, the device efficiency of the QLED is better when the thickness of the second energy level structure layer 32 is about 20 nm.

Figure 6:
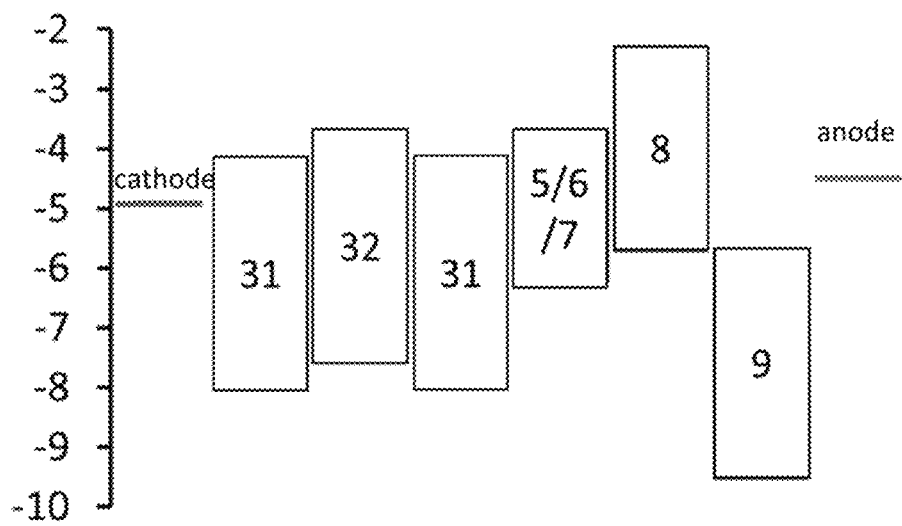
FIG. 6 is a schematic diagram illustrating a relationship between energy levels of layers in a QLED according to an embodiment of the present disclosure.
Figure 7:
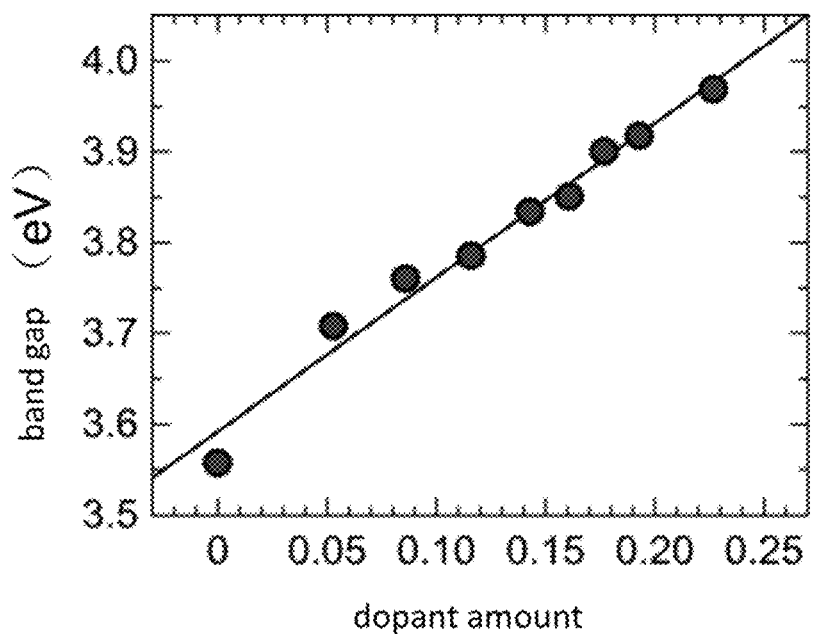
FIG. 7 is a schematic diagram of a change of a band gap of a second energy level structure layer with an increase in a dopant amount.

Still taking the case where the material of the first energy level structure layers 31 is ZnO, and the material of the second energy level structure layer 32 is GZO as an example, FIG. 6 is a schematic diagram illustrating a relationship between energy levels of the layers in the QLED according to the embodiment of the present disclosure, and FIG. 7 is a schematic diagram of a change of a band gap of the second energy level structure layer 32 with an increase in an amount of doped Ga.

As shown in FIG. 7, as the amount of doped Ga increases, the band gap of the second level structural layer 32 is increased, resulting in a reduction of conductivity of the second level structural layer 32.

The above description is only about the example in which the material of the first energy level structure layers 31 is ZnO and the material of the second energy level structure layer 32 is GZO. In fact, there are a plurality of choices of the materials of the first energy level structure layers 31 and the second energy level structure layer 32, as long as the LUMO energy levels of the first energy level structure layers 31 are different from the LUMO energy level of the second energy level structure layer 32.

For example, the material of the first energy level structure layers 31 may be GZO, and the material of the second energy level structure layer 32 may be ZnO.

That is to say, the material of one of the first energy level structure layer 31 and the second energy level structure layer 32 may be ZnO, and the material of the other one of the first energy level structure layer 31 and the second energy level structure layer 32 may be doped ZnO.

As a choice, ZnO may be doped with an element whose oxide has a lattice constant close to but not exactly the same as that of ZnO, and/or may be doped with an element whose electronegativity and radius are different from those of Zn. For example, the doped ZnO may be doped with at least one of gallium (Ga), indium (In), yttrium (Y), copper (Cu), zirconium (Zr), aluminum (Al) and magnesium (Mg), or any combination thereof. If a band gap of an oxide of the doped element is larger than that of ZnO, a band gap of the doped ZnO is usually increased and conductivity of the doped ZnO is usually reduced.

Certainly, each of the material of the first energy level structure layers 31 and the material of the second energy level structure layer 32 may be the doped ZnO. A dopant element in the first energy level structure layers 31 may be the same as or different from that in the second energy level structure layer 32. A doping concentration of dopant element in the first energy level structure layers 31 may be the same as or different from that in the second energy level structure layer 32.

The energy levels of the first energy level structure layers 31 and the second energy level structure layer 32 may be adjusted by adjusting the materials and the thicknesses of the first energy level structure layers 31 and the second energy level structure layer 32, so as to at least realize that the LUMO energy level of the second energy level structure layer 32 is different from the LUMO energy levels of the first energy level structure layers 31.

As an example, the doping concentration of dopant element in the doped ZnO may range from about 0% to about 50%.

Figure 8:
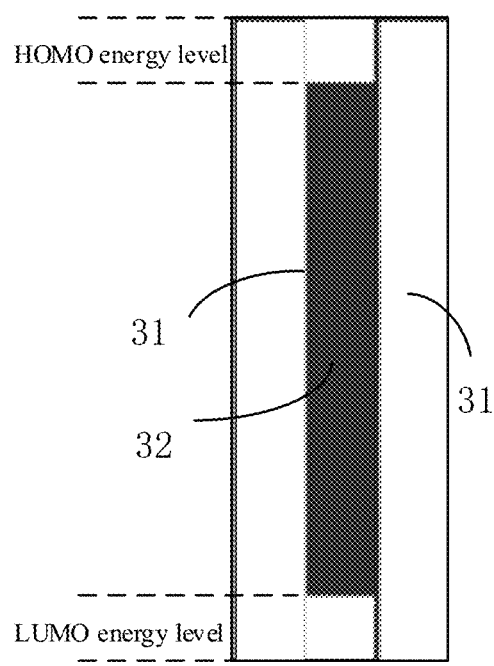
FIG. 8 to FIG. 14 are energy level diagrams of an electron transport layer in a QLED according to an embodiment of the present disclosure.
Figure 9:
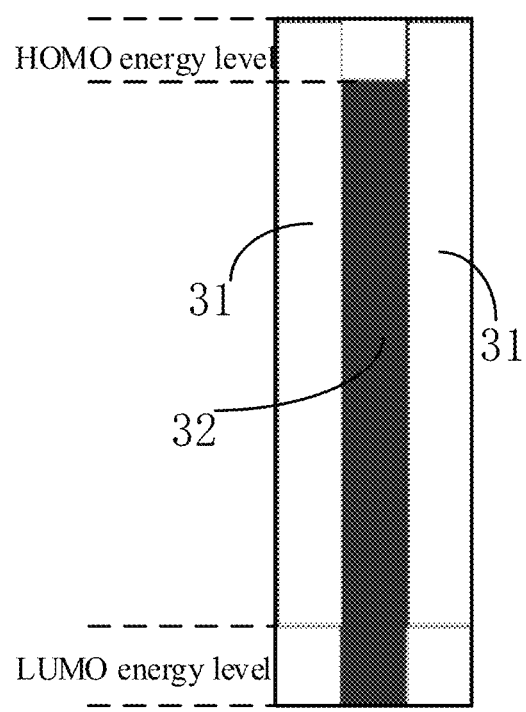
Figure 10:
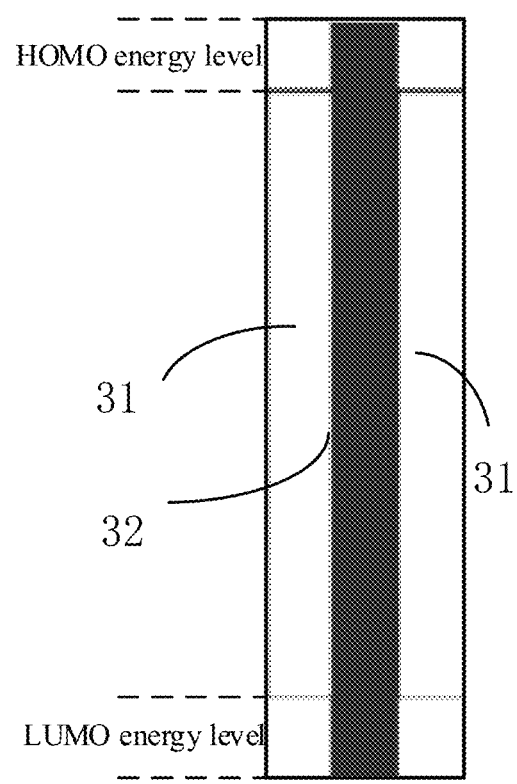

Each of FIG. 8 to FIG. 10 is an exemplary energy level diagram of an electron transport layer in a QLED according to an embodiment of the present disclosure. Each of electron transport layers 3 corresponding to the energy level diagrams shown in FIG. 8 to FIG. 10 includes a first energy level structure layer 31, a second energy level structure layer 32, and a first energy level structure layer 31, which are sequentially stacked.

Specifically, in some implementations, as shown in FIG. 8, an LUMO energy level of the second energy level structure layer 32 is higher than LUMO energy levels of the first energy level structure layers 31 and an HOMO energy level of the second energy level structure layer 32 is lower than HOMO energy levels of the first energy level structure layers 31, in such case, an energy level barrier is formed in the electron transport layer 3, thereby hindering the electron transport and reducing the electron transport rate.

In some implementations, as shown in FIG. 9, an LUMO energy level of the second energy level structure layer 32 is lower than LUMO energy levels of the first energy level structure layers 31, and an HOMO energy level of the second energy level structure layer 32 is lower than HOMO energy levels of the first energy level structure layers 31, in such case, an energy level trap is formed in the electron transport layer 3, thereby hindering the electron transport and reducing the electron transport rate.

In some implementations, as shown in FIG. 10, an LUMO energy level of the second energy level structure layer 32 is lower than LUMO energy levels of the first energy level structure layers 31, and an HOMO energy level of the second energy level structure layer 32 is higher than HOMO energy levels of the first energy level structure layer 31, in such case, an energy level trap is also formed in the electron transport layer 3, thereby hindering the electron transport and reducing the electron transport rate.

Moreover, as described above, the electron transport layer 3 includes at least the first energy level structure layer 31, the second energy level structure layer 32, and the first energy level structure layer 31, which are sequentially stacked. In some implementations, the electron transport layer 3 may include a plurality of stacked first energy level structure layers 31 and a plurality of stacked second energy level structure layers 3, and the first energy level structure layers 31 and the second energy level structure layers 32 may be stacked alternately, and each of a side of the electron transport layer 3 close to the cathode 2 and a side of the electron transport layer 3 close to the quantum dot light emitting layer is provided with the first energy level structure layer 31 or the second energy level structure layer 32.

For example, the electron transport layer 3 may include the second energy level structure layer 32, the first energy level structure layer 31, the second energy level structure layer 32, . . . . . . , the first energy level structure layer 31 and the second energy level structure layer 32, which are sequentially stacked, or the electron transport layer 3 may include the first energy level structure layer 31, the second energy level structure layer 32, the first energy level structure layer 31, . . . . . . , the second energy level structure layer 32 and the first energy level structure layer 31, which are sequentially stacked. In a case where each of the side of the electron transport layer 3 close to the cathode 2 and the side of the electron transport layer 3 close to the quantum dot light emitting layer is provided with the first energy level structure layer 31, or in a case where each of the side of the electron transport layer 3 close to the cathode 2 and the side of the electron transport layer 3 close to the quantum dot light emitting layer is provided with the second energy level structure layer 32, it can be ensured that the difference of energy level between the electron transport layer 3 and the cathode 2 and the difference of energy level between the electron transport layer 3 and the quantum dot light emitting layer are kept unchanged when the energy level composition in the electron transport layer 3 is changed.

Each of FIG. 11 to FIG. 14 is an exemplary energy level diagram of an electron transport layer 3 including a plurality of first energy level structure layers 31 and a plurality of second energy level structure layers 32.

Figure 11:
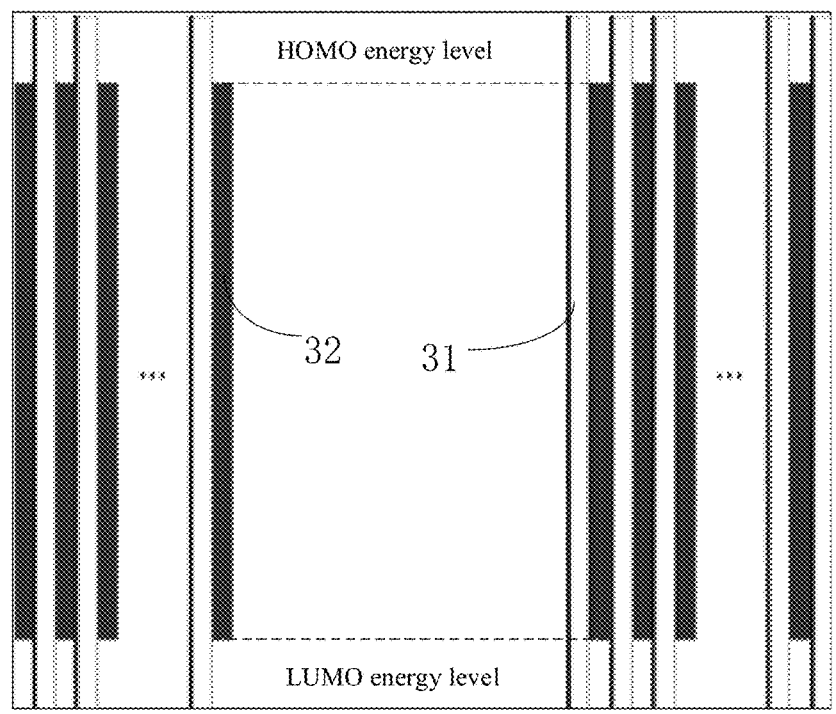

In some implementations, as shown in a left part of FIG. 11, the electron transport layer 3 includes the second energy level structure layer 32, the first energy level structure layer 31, the second energy level structure layer 32, . . . . . . , the first energy level structure layer 31 and the second energy level structure layer 32, which are sequentially stacked, LUMO energy levels of the second energy level structure layers 32 are higher than those of the first energy level structure layers 31, and HOMO energy levels of the second energy level structure layers 32 are lower than those of the first energy level structure layers 31.

In some implementations, as shown in a right part of FIG. 11, the electron transport layer 3 includes the first energy level structure layer 31, the second energy level structure layer 32, the first energy level structure layer 31, . . . . . . , the second energy level structure layer 32 and the first energy level structure layer 31, which are sequentially stacked, LUMO energy levels of the second energy level structure layers 32 are higher than those of the first energy level structure layers 31, and HOMO energy levels of the second energy level structure layers 32 are lower than those of the first energy level structure layers 31.

Figure 12:
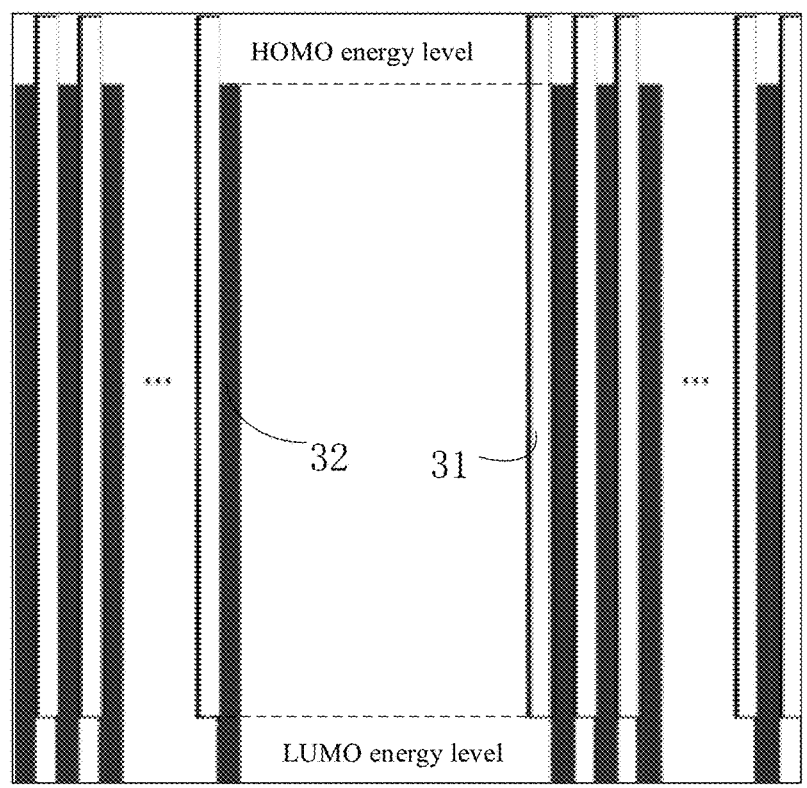

In some implementations, as shown in a left part of FIG. 12, the electron transport layer 3 includes the second energy level structure layer 32, the first energy level structure layer 31, the second energy level structure layer 32, . . . . . . , the first energy level structure layer 31 and the second energy level structure layer 32, which are sequentially stacked, LUMO energy levels of the second energy level structure layers 32 are lower than those of the first energy level structure layers 31, and HOMO energy levels of the second energy level structure layers 32 are lower than those of the first energy level structure layers 31.

In some implementations, as shown in a right part of FIG. 12, the electron transport layer 3 includes the first energy level structure layer 31, the second energy level structure layer 32, the first energy level structure layer 31, . . . . . . , the second energy level structure layer 32 and the first energy level structure layer 31, which are sequentially stacked, LUMO energy levels of the second energy level structure layers 32 are lower than those of the first energy level structure layers 31, and HOMO energy levels of the second energy level structure layers 32 are lower than those of the first energy level structure layers 31.

Figure 13:
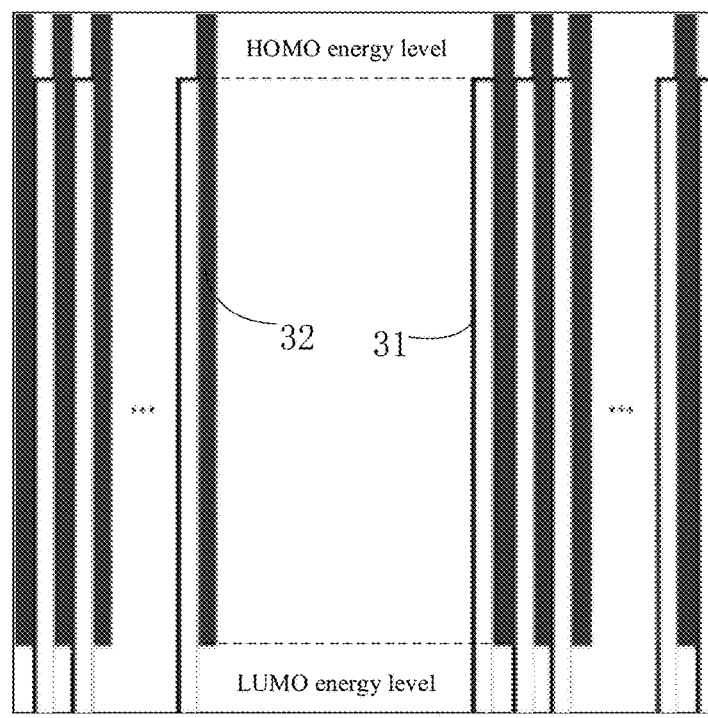

In some implementations, as shown in a left part of FIG. 13, the electron transport layer 3 includes the second energy level structure layer 32, the first energy level structure layer 31, the second energy level structure layer 32, . . . . . . , the first energy level structure layer 31 and the second energy level structure layer 32, which are sequentially stacked, LUMO energy levels of the second energy level structure layers 32 are higher than those of the first energy level structure layers 31, and HOMO energy levels of the second energy level structure layers 32 are higher than those of the first energy level structure layers 31.

In some implementations, as shown in a right part of FIG. 13, the electron transport layer 3 includes the first energy level structure layer 31, the second energy level structure layer 32, the first energy level structure layer 31, . . . . . . , the second energy level structure layer 32 and the first energy level structure layer 31, which are sequentially stacked, LUMO energy levels of the second energy level structure layers 32 are higher than those of the first energy level structure layers 31, and HOMO energy levels of the second energy level structure layers 32 are higher than those of the first energy level structure layers 31.

Figure 14:
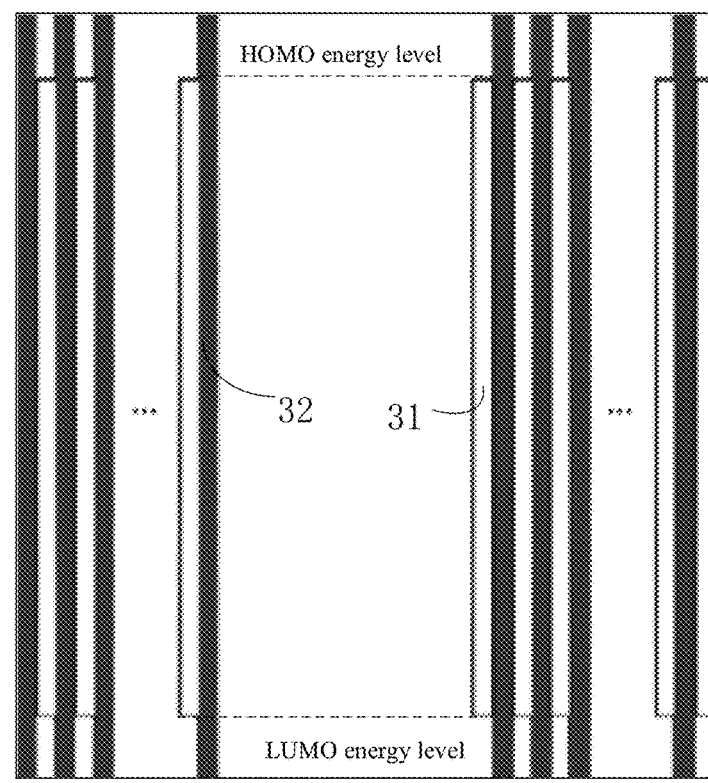

In some implementations, as shown in a left part of FIG. 14, the electron transport layer 3 includes the second energy level structure layer 32, the first energy level structure layer 31, the second energy level structure layer 32, . . . . . . , the first energy level structure layer 31 and the second energy level structure layer 32, which are sequentially stacked, LUMO energy levels of the second energy level structure layers 32 are lower than those of the first energy level structure layers 31, and HOMO energy levels of the second energy level structure layers 32 are higher than those of the first energy level structure layers 31.

In some implementations, as shown in a right part of FIG. 14, the electron transport layer 3 includes the first energy level structure layer 31, the second energy level structure layer 32, the first energy level structure layer 31, . . . . . . , the second energy level structure layer 32 and the first energy level structure layer 31, which are sequentially stacked, LUMO energy levels of the second energy level structure layers 32 are lower than those of the first energy level structure layers 31, and HOMO energy levels of the second energy level structure layers 32 are higher than those of the first energy level structure layers 31.

Figure 15A:
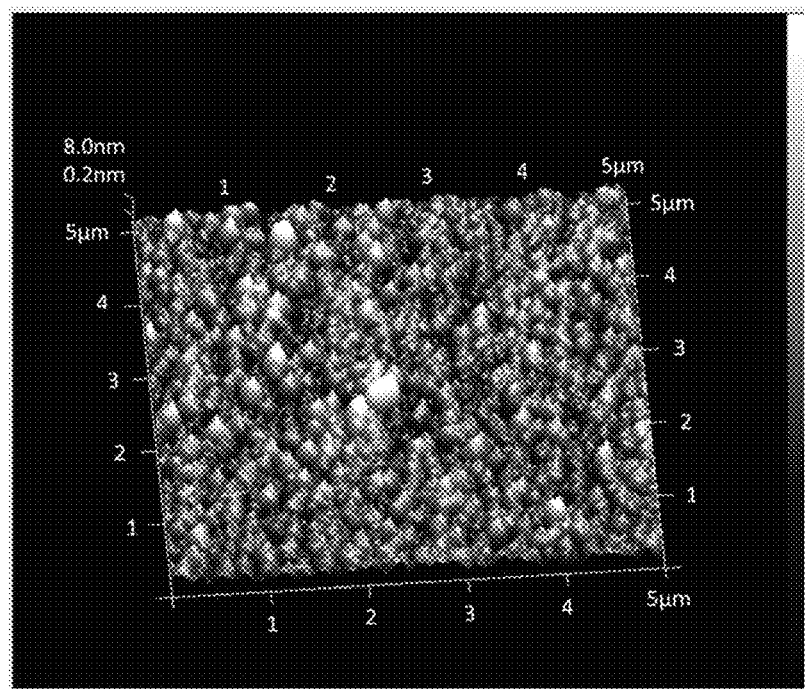
FIGS. 15(a) and 15(b) are schematic diagrams of surface roughness of an electron transport layer in a QLED according to an embodiment of the present disclosure.
Figure 15B:
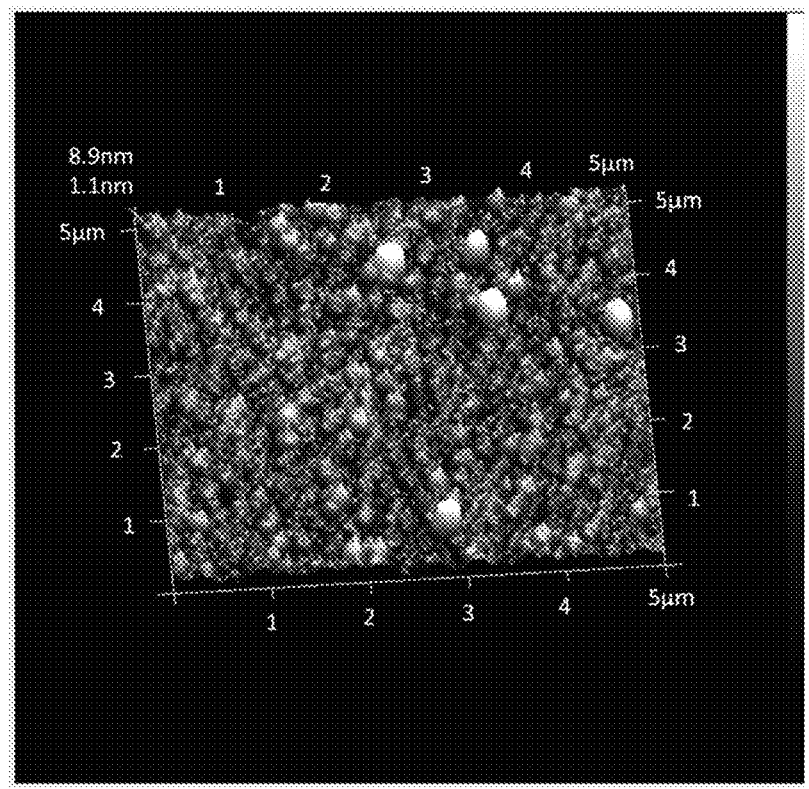

FIGS. 15(a) and 15(b) are schematic diagrams of surface roughness of an electron transport layer in a QLED according to the embodiment of the present disclosure.

The surface roughness of the electron transport layer in the QLED according to the embodiment of the present disclosure may be measured by an Atomic Force Microscope (AFM), and a value of a root mean square (RMS) of the surface roughness may be controlled within a range from about 1 nm to about 10 nm, more specifically, within a range from about 0.2 nm to about 8 nm as shown in FIG. 15(a), or within a range from about 1.1 nm to about 8.9 nm as shown in FIG. 15(b).

An embodiment of the present disclosure further provides a method for manufacturing a QLED, which may be used to manufacture the QLED provided by the embodiment of the present disclosure.

Figure 16:
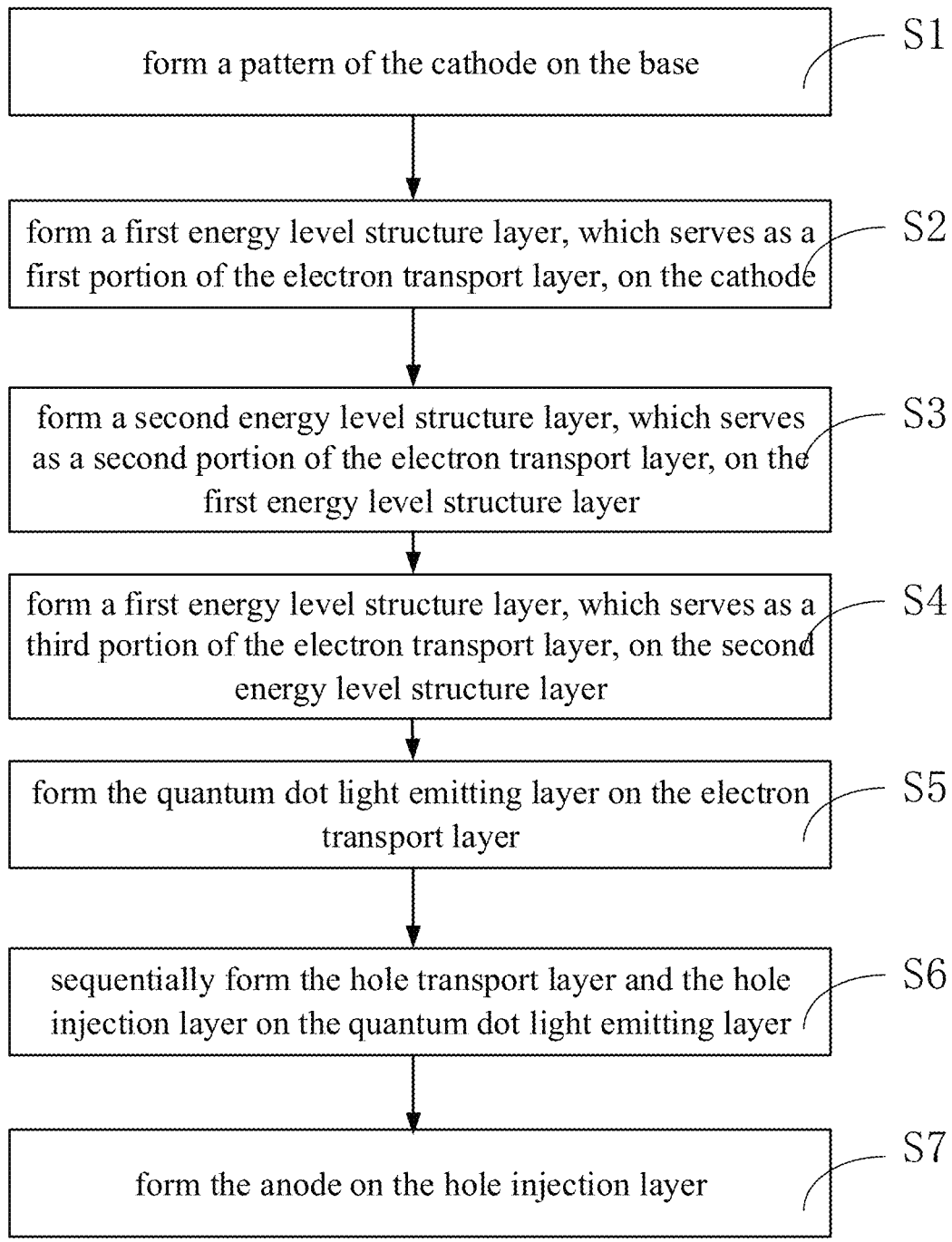
FIG. 16 is a flowchart illustrating a method for manufacturing a QLED according to an embodiment of the present disclosure.

FIG. 16 is a flowchart illustrating a method for manufacturing a QLED according to an embodiment of the present disclosure. With reference to FIG. 1 to FIG. 16, the method for manufacturing a QLED according to the embodiment of the present disclosure includes the following steps S1 to S7.

In the step S1, a pattern of the cathode 2 is formed on the base 1.

Specifically, the base 1 may be, for example, a glass base or a flexible PET base, and the cathode 2 may be a transparent electrode made of ITO, FTO or a conductive polymer, or may be an opaque electrode made of a metal such as Al or Ag.

For example, a conductive material layer (e.g., an ITO film or an FTO film) may be deposited on the base 1 by means of magnetron sputtering, sol-gel, atomic layer deposition or evaporation, and then is subjected to a patterning process to form the pattern of the cathode 2, and a thickness (a dimension perpendicular to a plane where the base 1 is located) of the cathode 2 may range from about 10 nm to about 100 nm.

In the step S2, the first energy level structure layer 31 is formed on the cathode 2 and serves as a first portion of the electron transport layer 3.

Specifically, a ZnO film or a doped ZnO film may be deposited on the cathode 2 by means of magnetron sputtering, sol-gel, atomic layer deposition or evaporation, and serves as the first portion of the electron transport layer 3.

A thickness of the first energy level structure layer 31 may be between about 5 nm and about 50 nm.

In the step S3, the second energy level structure layer 32 is formed on the first energy level structure layer 31 and serves as a second portion of the electron transport layer 3.

Specifically, a doped ZnO film or a ZnO film may be deposited on the first energy level structure layer 31 by means of magnetron sputtering, sol-gel, atomic layer deposition or evaporation, and serves as the second portion of the electron transport layer 3.

For example, in a case where a material of the first energy level structure layer 31 is ZnO, a material of the second energy level structure layer 32 may be doped ZnO; and in a case where the material of the first energy level structure layer 31 is the doped ZnO, the material of the second energy level structure layer 32 may be ZnO or the doped ZnO.

A thickness of the second energy level structure layer 32 may be between about 10 nm and about 50 nm.

In the step S4, the first energy level structure layer 31 is formed on the second energy level structure layer 32 and serves as a third portion of the electron transport layer 3.

Specifically, a ZnO film or a doped ZnO film may be deposited on the second energy level structure layer 32 by means of magnetron sputtering, sol-gel, atomic layer deposition or evaporation, and serves as the third portion of the electron transport layer 3.

The first energy level structure layer 31 serving as the first portion of the electron transport layer 3, the second energy level structure layer 32 serving as the second portion of the electron transport layer 3, and the first energy level structure layer 31 serving as the third portion of the electron transport layer 3 constitute the entire electron transport layer 3.

The materials and thicknesses of the first energy level structure layers 31 on two sides of the second energy level structure layer 32 may be the same or different, as long as an LUMO energy level of the second energy level structure layer 32 is different from LUMO energy levels of the first energy level structure layers 31.

As an example, an element doped in the doped ZnO may be at least one of Ga, In, Y, Cu, Zr, Al and Mg, or any combination thereof, and a doping concentration of dopant element in the doped ZnO may range from about 0% to about 50%, and may be selected by those skilled in the art as desired.

For example, the doped ZnO may be GZO doped with Ga, and a doping concentration of Ga is about 20%.

In the embodiment of the present disclosure, by using magnetron sputtering, sol-gel, atomic layer deposition or evaporation to form the cathode 2 and the electron transport layer 3, thicknesses of film layers of the obtained cathode 2 and electron transport layer 3 are relatively uniform.

In the step S5, the quantum dot light emitting layer is formed on the electron transport layer 3.

Specifically, the quantum dot light emitting layer may be formed on the electron transport layer 3 by printing (e.g., inkjet printing). For example, the quantum dot light emitting layer may be the red quantum dot light emitting layer 5, the green quantum dot light emitting layer 6, or the blue quantum dot light emitting layer 7, and may have a thickness ranging from about 20 nm to about 50 nm, and the quantum dot light emitting layers of various colors may have different thicknesses.

Using a printing method to form the quantum dot light emitting layer can facilitate effective utilization of a quantum dot material and preparation of a quantum dot light emitting layer having a relatively large area.

Certainly, the pixel defining layer 4 may be formed before the quantum dot light emitting layers of various colors are formed, and a method and a material for manufacturing the pixel defining layer 4 are not particularly limited in the embodiment of the present disclosure. For example, the pixel defining layer 4 may be formed by a photolithography process.

In the step S6, the hole transport layer 8 and the hole injection layer 9 are sequentially formed on the quantum dot light emitting layer.

Specifically, the hole transport layer 8 and the hole transport layer 9 may be sequentially deposited by means of spin coating or evaporation.

It should be understood that the step S6 may be omitted. In some implementations, the hole transport layer 8 and the hole injection layer 9 are not to be formed.

In addition, materials and thicknesses of the hole transport layer 8 and the hole injection layer 9 are not particularly limited in the embodiment of the present disclosure.

In the step S7, the anode 10 is formed on the hole injection layer 9.

Specifically, the anode 10 may be formed by means of magnetron sputtering, sol-gel, atomic layer deposition or evaporation, a material of the anode 10 may be Indium Zinc Oxide (IZO), aluminum (Al) or silver (Ag), and a thickness of the anode 10 may range from about 10 nm to about 100 nm.

In the QLED formed by the method for manufacturing a QLED provided by the embodiment of the present disclosure, an energy level trap or an energy level barrier may be formed in the electron transport layer 3, and can hinder electron transport and reduce an electron transport rate, thereby effectively balancing injection of carriers (electrons and holes) in the QLED, and ensuring QLED performance (e.g., luminous efficiency) to some extent.

An embodiment of the present disclosure further provides a display device, which includes a display substrate, and the display substrate includes a plurality of QLEDs arranged in an array, and each of a portion or all of the QLEDs is the QLED provided by the above embodiment of the present disclosure.

Due to the application of the QLED provided by the embodiment of the present disclosure, the display device according to the embodiment of the present disclosure has a relatively good display effect.

The display device provided by the embodiment of the present disclosure may be any product or component having a display function, such as electronic paper, an OLED panel, a QLED panel, a mobile phone, a tablet computer, a television, a display, a notebook computer, a digital photo frame, or a navigator.

It should be understood that the above implementations are merely exemplary implementations adopted to illustrate the principle of the present disclosure, and the present disclosure is not limited thereto. Various modifications and improvements may be made by people of ordinary sill in the art without departing from the spirit and essence of the present disclosure, and those modifications and improvements are considered to fall within the scope of the present disclosure.

What is claimed is:

1. A quantum dot light emitting diode, comprising an anode layer, a cathode layer, a quantum dot light emitting layer between the anode layer and the cathode layer, and an electron transport layer between the cathode layer and the quantum dot light emitting layer, wherein
    the electron transport layer comprises at least a first energy level structure layer, a second energy level structure layer, and another first energy level structure layer, which are sequentially stacked, the first energy level structure layer is different from the second energy level structure layer, and a Lowest Unoccupied Molecular Orbital energy level of the first energy level structure layer is different from that of the second energy level structure layer,
    wherein a material of one of the first energy level structure layer and the second energy level structure layer is zinc oxide, and a material of the other one of the first energy level structure layer and the second energy level structure layer is doped zinc oxide.

2. The quantum dot light emitting diode of claim 1, wherein the Lowest Unoccupied Molecular Orbital energy level of the first energy level structure layer is higher than that of the second energy level structure layer.

3. The quantum dot light emitting diode of claim 1, wherein the Lowest Unoccupied Molecular Orbital energy level of the first energy level structure layer is lower than that of the second energy level structure layer.

4. The quantum dot light emitting diode of claim 1, wherein the Lowest Unoccupied Molecular Orbital energy level of the first energy level structure layer is different from that of the second energy level structure layer by about 0.1 eV to about 0.5 eV.

5. The quantum dot light emitting diode of claim 1, wherein a thickness of the electron transport layer ranges from about 20 nm to about 150 nm.

6. The quantum dot light emitting diode of claim 1, wherein a material of at least one of the first energy level structure layer and the second energy level structure layer is doped zinc oxide.

7. The quantum dot light emitting diode of claim 6, wherein an element doped in the doped zinc oxide comprises at least one of gallium, indium, yttrium, copper, zirconium, aluminum and magnesium, or any combination thereof, or
a doping concentration of dopant element in the doped zinc oxide ranges from about 0% to about 50%.

8. The quantum dot light emitting diode of claim 1, wherein the electron transport layer comprises a plurality of first energy level structure layers and a plurality of second energy level structure layers, the first energy level structure layers and the second energy level structure layers are stacked alternately, and each of a side of the electron transport layer close to the cathode layer and a side of the electron transport layer close to the quantum dot light emitting layer is provided with the first energy level structure layer or the second energy level structure layer.

9. The quantum dot light emitting diode of claim 1, wherein a value of a root mean square of surface roughness of the electron transport layer ranges from about 1 nm to about 10 nm.

10. The quantum dot light emitting diode of claim 1, further comprising a hole transport layer and a hole injection layer, wherein
the cathode layer, the electron transport layer, the quantum dot light emitting layer, the hole transport layer, the hole injection layer and the anode layer are sequentially stacked on a base.

11. A display device, comprising a display substrate comprising a plurality of quantum dot light emitting diodes arranged in an array, wherein the plurality of quantum dot light emitting diodes comprise the quantum dot light emitting diode of claim 1.

12. A method for manufacturing a quantum dot light emitting diode, comprising steps of forming an anode layer, a cathode layer, a quantum dot light emitting layer between the anode layer and the cathode layer, and an electron transport layer between the cathode layer and the quantum dot light emitting layer, wherein
the step of forming the electron transport layer comprises:
forming a first energy level structure layer, a second energy level structure layer, and another first energy level structure layer, which are sequentially stacked, with the first energy level structure layer being different from the second energy level structure layer, and a Lowest Unoccupied Molecular Orbital energy level of the first energy level structure layer being different from that of the second energy level structure layer,
wherein the forming a first energy level structure layer, a second energy level structure layer, and another first energy level structure layer, which are sequentially stacked, comprises:
using a zinc oxide material to form one of the first energy level structure layer and the second energy level structure layer from; and
using a doped zinc oxide material to form the other one of the first energy level structure layer and the second energy level structure layer.

13. The method of claim 12, wherein the forming a first energy level structure layer, a second energy level structure layer, and another first energy level structure layer, which are sequentially stacked, comprises:
forming the first energy level structure layer, the second energy level structure layer, and the first energy level structure layer by a sputtering method, a sol-gel method, or an atomic layer deposition method.

14. The method of claim 12, further comprising:
forming the quantum dot light emitting layer on the electron transport layer by printing; and
sequentially forming a hole transport layer and a hole injection layer on the quantum dot light emitting layer by evaporation.

15. The method of claim 12, wherein the electron transport layer is formed so that the Lowest Unoccupied Molecular Orbital energy level of the first level structural layer is different from that of the second level structural layer by about 0.1 eV to about 0.5 eV.

16. The method of claim 12, wherein the forming a first energy level structure layer, a second energy level structure layer, and another first energy level structure layer, which are sequentially stacked, comprises:
using a doped zinc oxide material to form at least one of the first energy level structure layer and the second energy level structure layer.

17. The method of claim 16, wherein the using a doped zinc oxide material comprises:
using a doped zinc oxide material doped with at least one of gallium, indium, yttrium, copper, zirconium, aluminum and magnesium, or any combination thereof, or
using a doped zinc oxide material having a doping concentration of dopant element ranging from about 0% to about 50%.

18. The method of claim 12, wherein the forming a first energy level structure layer, a second energy level structure layer, and another energy level structure layer, which are sequentially stacked, comprises:
forming a plurality of first energy level structure layers and a plurality of second energy level structure layers, with the first energy level structure layers and the second energy level structure layers being stacked alternately, and each of a side of the electron transport layer close to the cathode layer and a side of the electron transport layer close to the quantum dot light emitting layer being provided with the first energy level structure layer or the second energy level structure layer.

* * * * *